United States Patent
Taguchi et al.

(10) Patent No.: US 10,522,773 B2
(45) Date of Patent: Dec. 31, 2019

(54) RADIATION DETECTOR

(71) Applicant: Kabushiki Kaisha Toshiba, Minato-ku (JP)

(72) Inventors: Satomi Taguchi, Ota (JP); Atsushi Wada, Kawasaki (JP); Isao Takasu, Setagaya (JP); Mitsuyoshi Kobayashi, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/692,615

(22) Filed: Aug. 31, 2017

(65) Prior Publication Data

US 2018/0254420 A1 Sep. 6, 2018

(30) Foreign Application Priority Data

Mar. 3, 2017 (JP) .................. 2017-040461

(51) Int. Cl.
*H01L 51/44* (2006.01)
*H01L 27/30* (2006.01)
*G01T 1/24* (2006.01)

(52) U.S. Cl.
CPC .............. *H01L 51/441* (2013.01); *G01T 1/24* (2013.01); *G01T 1/242* (2013.01); *H01L 27/307* (2013.01); *H01L 2251/301* (2013.01); *H01L 2251/303* (2013.01); *Y02E 10/549* (2013.01)

(58) Field of Classification Search
CPC ...... H01L 51/441; H01L 27/307; G01T 1/242
See application file for complete search history.

(56) References Cited

U.S. PATENT DOCUMENTS

| | | | | |
|---|---|---|---|---|
| 3,383,993 A | * | 5/1968 | Yeh ........................ | G03G 13/14 399/131 |
| 3,772,013 A | * | 11/1973 | Wells ...................... | G03G 17/04 430/34 |
| 5,365,056 A | | 11/1994 | Sklebitz et al. | |
| 5,508,507 A | * | 4/1996 | Nelson ..................... | H04N 5/30 250/214 LA |
| 7,119,334 B2 | * | 10/2006 | Secundo ............... | G02F 1/0147 250/331 |
| 7,977,643 B2 | * | 7/2011 | Weinberg .................. | G01T 1/16 250/370.01 |
| 8,058,093 B2 | * | 11/2011 | Wadell .................. | H01L 27/301 257/E51.013 |
| 8,154,631 B2 | | 4/2012 | Herrmann et al. | |

(Continued)

FOREIGN PATENT DOCUMENTS

| | | |
|---|---|---|
| JP | 6-187930 A | 7/1994 |
| JP | 2009-94465 A | 4/2009 |

(Continued)

OTHER PUBLICATIONS

G. N. Ankah, et al., "PbS Quantum Dot Based Hybrid-Organic Photodetectors for X-ray Sensing", Organic Electronics, vol. 33, 2016, pp. 201-206.

*Primary Examiner* — Ida M Soward
(74) *Attorney, Agent, or Firm* — Oblon, McClelland, Maier & Neustadt, L.L.P.

(57) ABSTRACT

According to one embodiment, a radiation detector includes a stacked body. The stacked body includes a first metal layer, a second metal layer, and an organic semiconductor layer provided between the first metal layer and the second metal layer.

12 Claims, 4 Drawing Sheets

(56) References Cited

U.S. PATENT DOCUMENTS

| | | | |
|---|---|---|---|
| 8,575,589 B2* | 11/2013 | Nagashima | H01L 27/101 257/5 |
| 8,829,497 B2* | 9/2014 | Kijima | H01L 51/5278 257/40 |
| 8,829,510 B2* | 9/2014 | Komatsu | H01L 27/3279 257/40 |
| 8,884,231 B2* | 11/2014 | Noda | G01T 1/2002 250/361 R |
| 8,936,898 B2* | 1/2015 | Nam | B82Y 10/00 264/293 |
| 9,625,312 B2* | 4/2017 | Hicks | G01J 1/46 |
| 2004/0067324 A1* | 4/2004 | Lazarev | H01L 51/0012 428/1.31 |
| 2004/0178426 A1* | 9/2004 | Melekhov | H01L 27/14676 257/233 |
| 2007/0103066 A1* | 5/2007 | D'Andrade | H01L 27/3209 313/506 |
| 2008/0305574 A1* | 12/2008 | Park | B82Y 10/00 438/99 |
| 2009/0179155 A1 | 7/2009 | Weinberg | |
| 2010/0314547 A1* | 12/2010 | Kudo | G01T 1/20 250/368 |
| 2011/0023955 A1* | 2/2011 | Fonash | B82Y 20/00 136/256 |
| 2011/0095266 A1 | 4/2011 | Hayden et al. | |
| 2012/0080087 A1* | 4/2012 | Denby | H01L 31/035281 136/256 |
| 2012/0241627 A1* | 9/2012 | Noda | G01T 1/202 250/361 R |
| 2012/0295360 A1* | 11/2012 | Swager | B82Y 15/00 436/58 |
| 2013/0126743 A1* | 5/2013 | Iwakiri | A61B 6/4216 250/366 |
| 2014/0014844 A1* | 1/2014 | Watanabe | G01T 1/2928 250/366 |
| 2014/0042329 A1* | 2/2014 | Okada | G01T 1/2006 250/366 |
| 2015/0185337 A1* | 7/2015 | Kawanishi | G01T 1/203 250/367 |
| 2016/0225827 A1 | 8/2016 | Park et al. | |
| 2017/0265822 A1* | 9/2017 | Du | A61B 6/03 |
| 2018/0277779 A1 | 9/2018 | Takasu et al. | |

FOREIGN PATENT DOCUMENTS

| | | |
|---|---|---|
| JP | 5458260 B2 | 1/2014 |
| JP | 5460706 B2 | 4/2014 |
| JP | 2009-212377 A | 11/2014 |
| JP | 2014-529728 A | 11/2014 |
| JP | 2018-155720 A | 10/2018 |

* cited by examiner

RADIATION DETECTOR

CROSS-REFERENCE TO RELATED APPLICATIONS

This application is based upon and claims the benefit of priority from Japanese Patent Application No. 2017-040461, filed on Mar. 3, 2017; the entire contents of which are incorporated herein by reference.

FIELD

Embodiments described herein relate generally to a radiation detector.

BACKGROUND

It is desirable to increase the sensitivity of a radiation detector.

DETAILED DESCRIPTION

According to one embodiment, a radiation detector includes a stacked body. The stacked body includes a first metal layer, a second metal layer, and an organic semiconductor layer provided between the first metal layer and the second metal layer.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1:
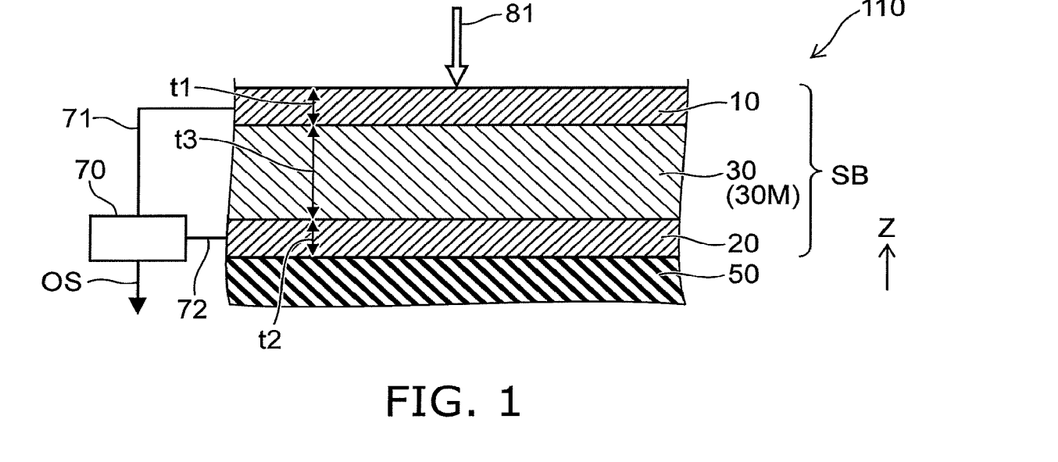
FIG. 1 is a schematic cross-sectional view illustrating a radiation detector according to a first embodiment.

FIG. 1 is a schematic cross-sectional view illustrating a radiation detector according to a first embodiment.

As shown in FIG. 1, the radiation detector 110 according to the embodiment includes a stacked body SB. The stacked body SB includes a first metal layer 10, a second metal layer 20, and an organic semiconductor layer 30. A substrate 50 is provided in the example.

The organic semiconductor layer 30 is provided between the first metal layer 10 and the second metal layer 20. For example, the second metal layer 20 is provided between the substrate 50 and the first metal layer 10.

The organic semiconductor layer 30 includes, for example, an organic semiconductor region 30M. The organic semiconductor region 30M includes, for example, a p-type semiconductor material and an n-type semiconductor material. Examples of the organic semiconductor region 30M are described below.

For example, radiation 81 (e.g., β-rays) is incident on the stacked body SB. A movable charge is generated in the organic semiconductor layer 30 by the radiation 81.

For example, the charge recited above is extracted when a bias voltage is applied between the first metal layer 10 and the second metal layer 20. The amount of the charge that is extracted corresponds to, for example, the radiation 81 incident on the stacked body SB. An electrical signal that corresponds to the radiation 81 is obtained.

A detection circuit 70 is provided in the example. The detection circuit 70 is electrically connected to the first metal layer 10 and the second metal layer 20. For example, the detection circuit 70 and the first metal layer 10 are electrically connected by a first interconnect 71. For example, the detection circuit 70 and the second metal layer 20 are electrically connected by a second interconnect 72. The detection circuit 70 outputs a signal OS that corresponds to the intensity of the radiation 81 incident on the stacked body SB. The first metal layer 10 and the second metal layer 20 function as electrodes.

In the embodiment, the organic semiconductor layer 30 is provided between the first metal layer 10 and the second metal layer 20. These metal layers attenuate light. For example, these metal layers suppress the ambient light (the outside light) that is incident on the organic semiconductor layer 30.

For example, there is a reference example in which a transmissive conductive layer (e.g., ITO (Indium Tin Oxide)) is used as an electrode. In the reference example, the ambient light (the outside light) is incident on the organic semiconductor layer 30 because the electrode is light-transmissive. There are cases where, for example, a current that is caused by the ambient light (the outside light) flows in the organic semiconductor layer 30. The current becomes a noise current and reduces the sensitivity of the detection of the radiation 81.

In the embodiment, the organic semiconductor layer 30 is provided between the first metal layer 10 and the second metal layer 20. These metal layers suppress the ambient light (the outside light) that is incident on the organic semiconductor layer 30. Thereby, the noise current is suppressed; and high sensitivity when detecting the radiation 81 is obtained. According to the embodiment, a radiation detector can be provided in which the sensitivity can be increased.

In the embodiment, the radiation 81 is incident on the stacked body SB from, for example, the first metal layer 10 side. For example, the radiation 81 is incident on the organic semiconductor layer 30 after passing through the first metal layer 10. A material that has a relatively small atomic weight is used as the first metal layer 10. Thereby, the radiation 81 of the detection object passes through the first metal layer 10 and can be incident on the organic semiconductor layer 30. At this time, the outside light is attenuated by the first metal layer 10.

A thickness t1 of the first metal layer 10 (referring to FIG. 1) is, for example, 100 nanometers (nm) or more. Thereby, the outside light is attenuated effectively by the first metal layer 10. The thickness t1 of the first metal layer 10 is 500 nm or less. In the case where the thickness t1 is excessively thick, for example, cracks that are caused by stress, etc., may occur in the first metal layer 10.

For example, the transmittance of the first metal layer 10 for light of a wavelength of 550 nanometers is 1 percent or less. The outside light is attenuated effectively. High sensitivity is obtained by the amount that the outside light is attenuated.

On the other hand, the second metal layer 20 includes a material that has a relatively large atomic weight. Thereby, for example, backscattering occurs when the radiation 81 that is incident on the organic semiconductor layer 30 is incident on the second metal layer 20. Thereby, at least a portion of the radiation 81 travels from the second metal layer 20 toward the organic semiconductor layer 30. Charge is generated in the organic semiconductor layer 30 by the radiation 81. Charge that is based on the backscattering also is detected. Thereby, higher sensitivity is obtained.

For example, the atomic weight of a second metal included in the second metal layer 20 is larger than the atomic weight of a first metal included in the first metal layer 10.

For example, the first metal includes at least one selected from the group consisting of aluminum, silver, nickel, and magnesium. The first metal layer 10 may include an alloy including such a first metal.

For example, the second metal includes at least one selected from the group consisting of gold and platinum. The second metal layer 20 may include an alloy including such a second metal. The second metal may include, for example, tungsten.

As described below, in the case where the second metal includes gold, it is favorable for a thickness t2 of the second metal layer 20 (referring to FIG. 1) to be not less than 10 micrometers and not more than 40 micrometers. Also, in the case where the second metal includes platinum, it is favorable for the thickness t2 of the second metal layer 20 to be not less than 10 micrometers and not more than 40 micrometers. Thereby, the backscattering of the radiation 81 is obtained effectively.

In the embodiment, a thickness t3 of the organic semiconductor layer 30 (referring to FIG. 1) is not less than 10 micrometers and not more than 200 micrometers. Thereby, the radiation 81 such as, for example, β-rays, etc., are converted into charge effectively in the organic semiconductor layer 30. High sensitivity is obtained. For example, the sensitivity to γ-rays is high in the case where the thickness t3 is excessively thick. For example, the detection of β-rays substantially decreases due to the high sensitivity to γ-rays. For example, the trap efficiency of β-rays is low in the case where the thickness t3 is excessively thin.

The thicknesses recited above are, for example, lengths along the direction (e.g., a Z-axis direction) from the second metal layer 20 toward the first metal layer 10.

In the embodiment, it is favorable for the work function of the second metal included in the second metal layer 20 to be large. The work function of the second metal is, for example, greater than 4.7 electron volts (eV).

There is a reference example in which ITO or the like is used as the electrodes. The work function of ITO is about 4.7 eV. In such a case, for example, the charge (the electrons) moves easily from the ITO electrodes toward the organic semiconductor layer 30. The charge becomes noise current.

In the embodiment, the work function of the second metal included in the second metal layer 20 is large. For example, the work function of the second metal is greater than 4.7 eV. Thereby, the noise current can be small compared to the reference example in which the ITO electrodes are used. Thereby, a higher detection precision is obtained.

For example, the work function of gold is about 5.1 eV. The work function of platinum is about 5.65 eV. The noise current can be small by using such metals.

On the other hand, in the reference example in which the ITO electrodes are used, the barrier to holes from the organic semiconductor layer 30 toward the ITO electrodes is high. Therefore, the extraction efficiency of the holes is insufficient.

Conversely, in the embodiment, the work function of the second metal included in the second metal layer 20 is large. Thereby, the barrier to holes from the organic semiconductor layer 30 toward the second metal layer 20 is low. Therefore, a high extraction efficiency of the holes is obtained. Thereby, a high external quantum efficiency (EQE) is obtained.

In the embodiment, a large electromotive force is obtained because the work function of the second metal included in the second metal layer 20 is large. Therefore, the bias voltage can be small. For example, the configuration of the detection circuit 70 is simple.

Figure 2:
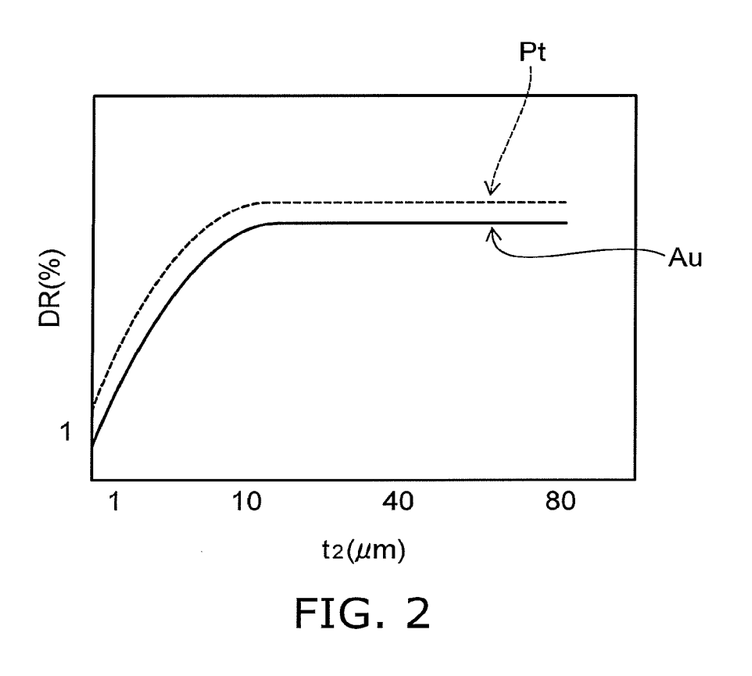
FIG. 2 is a graph illustrating a characteristic of the radiation detector.

An example of a characteristic when the second metal layer 20 is changed will now be described.

FIG. 2 is a graph illustrating a characteristic of the radiation detector.

FIG. 2 shows the characteristic of a detection ratio DR of the radiation when changing the thickness t2 of the second metal layer 20 (referring to FIG. 1) in the case where the second metal is gold (Au) or platinum (Pt). In the example, the first metal layer 10 is Al. The thickness t1 of the first metal layer 10 is 100 nm. The thickness t3 of the organic semiconductor layer 30 is 10 μm.

The detection ratio DR of the radiation is the detection ratio when radiation (corresponding to radiation (β-rays) of cobalt) of 318 KeV is irradiated on the radiation detector. The detection ratio DR is the ratio, to the amount of the β-rays that are irradiated, of the amount of the β-rays for which the energy is lower than the "noise level" in the organic semiconductor layer 30. The detection ratio DR is normalized to be a value of 1 when the thickness t2 of the second metal layer 20 is 1 μm. A high detection ratio DR corresponds to high sensitivity.

It can be seen from FIG. 2 that in the case where the second metal includes gold and in the case where the second metal includes platinum, a high detection ratio DR is obtained when the thickness t2 of the second metal layer 20 is 10 μm or more. The detection ratio DR is high when the thickness t2 is not less than 10 μm and not more than 80 μm. The detection ratio DR increases as the thickness t2 increases when the thickness t2 is less than 10 μm.

It is favorable for the thickness t2 of the second metal layer 20 to be 10 μm or more in the case where the second metal includes gold and in the case where the second metal includes platinum.

Charge is generated by the backscattering of the β-rays (the electron beams) incident on the second metal layer 20; and the charge is detected. It is considered that the level of the backscattering is low in the case where the thickness t2 of the second metal layer 20 is excessively thin. It is considered that sufficient backscattering is obtained in the case where the thickness t2 is 10 μm or more.

It is considered that the proportion of the backscattering of the β-rays is dependent on the distance (the penetration range) that the β-rays can travel when passing through a substance. It is considered that the proportion of the backscattering of the β-rays (the electron beams) is saturated at, for example, a thickness of about ½ of the penetration range. Accordingly, it is considered that the level of the backscattering is saturated when the thickness t2 of the second metal layer 20 is ½ of the penetration range or more.

For example, it is considered that the penetration range of β-rays is about 80 μm for gold or platinum. The level of the backscattering is substantially constant for a thickness t2 of the second metal layer 20 of about 40 μm which is ½ of the penetration range.

Cracks occur easily in the case where the thickness t2 of the second metal layer 20 is excessively thick. Therefore, it is favorable for the thickness t2 to be 80 μm or less. It is more favorable for the thickness t2 to be 40 μm or less. The cracks can be suppressed effectively.

Figure 3:
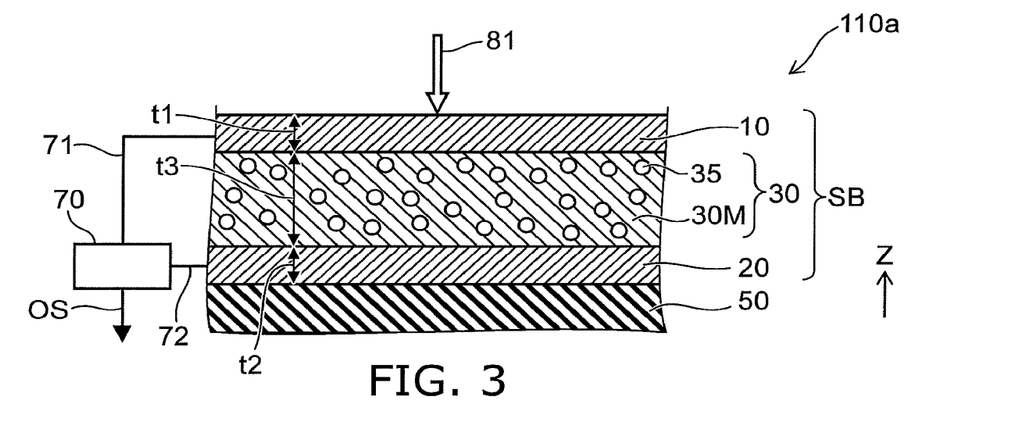
FIG. 3 is a schematic cross-sectional view illustrating another radiation detector according to the first embodiment.

In the embodiment, the organic semiconductor layer 30 may include multiple particles. An example will now be described.

FIG. 3 is a schematic cross-sectional view illustrating another radiation detector according to the first embodiment.

In the other radiation detector 110a according to the embodiment as shown in FIG. 3, the organic semiconductor layer 30 includes the organic semiconductor region 30M and multiple particles 35. Otherwise, the configuration of the radiation detector 110 is similar to, for example, that of the radiation detector 110.

At least a portion of the organic semiconductor region 30M is provided around the multiple particles 35. For example, the organic semiconductor region 30M includes a portion provided around the multiple particles 35. For example, the multiple particles 35 are dispersed in the organic semiconductor region 30M. At least two of the multiple particles 35 may be separated from each other. At least two of the multiple particles 35 may contact each other. For example, the organic semiconductor region 30M surrounds the periphery of at least a portion of the multiple particles 35. A portion of one of the multiple particles 35 may be exposed from the organic semiconductor region 30M.

The multiple particles 35 include, for example, at least one selected from the group consisting of PbS, ZnSe, $Bi_2O_3$, and $HfO_2$.

The size (e.g., the diameter) of the multiple particles 35 is, for example, 100 nanometers or less.

For example, the radiation 81 is converted into charge efficiently by the multiple particles 35. For example, excitons are generated by the radiation 81 being incident on the organic semiconductor region 30M. The excitons are separated into electrons/holes to become charge at the interfaces of the organic semiconductor (the organic semiconductor region 30M) and the nanoparticles. The charge is extracted as a detection current.

Figure 4:
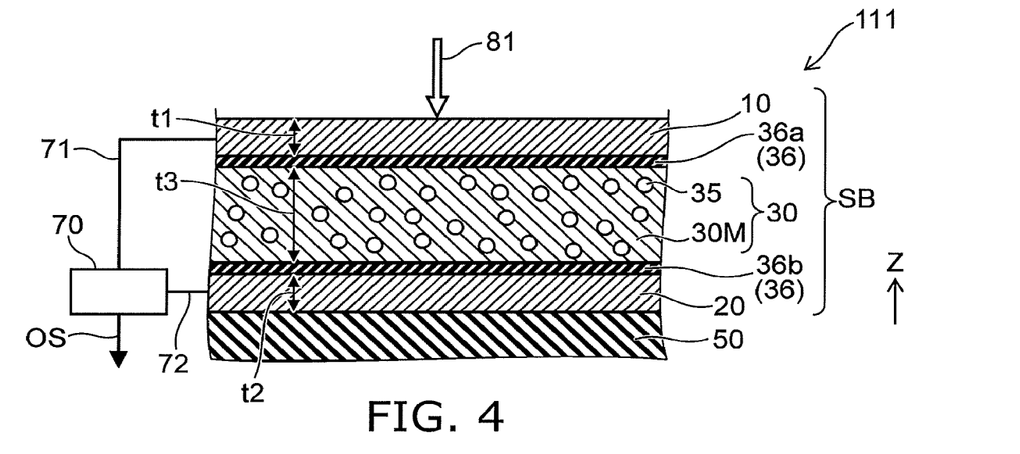
FIG. 4 is a schematic cross-sectional view illustrating another radiation detector according to the first embodiment.

FIG. 4 is a schematic cross-sectional view illustrating another radiation detector according to the first embodiment.

As shown in FIG. 4, the other radiation detector 111 according to the embodiment includes an organic film 36. Otherwise, the radiation detector 111 is similar to the radiation detector 110.

The organic film 36 is provided in at least one of a first position between the first metal layer 10 and the organic semiconductor layer 30 or a second position between the second metal layer 20 and the organic semiconductor layer 30. In the example, the organic film 36 includes a first organic film 36a and a second organic film 36b. The first organic film 36a is provided between the first metal layer 10 and the organic semiconductor layer 30. The second organic film 36b is provided between the second metal layer 20 and the organic semiconductor layer 30.

The first organic film 36a includes, for example, an electron-accepting material. The electron-accepting material includes, for example, a triazole compound, etc. Examples of the material of the first organic film 36a are described below. The thickness of the first organic film 36a is, for example, not less than 50 nm and not more than 100 nm.

The first organic film 36a may function as, for example, a hole blocking film. For example, the first organic film 36a suppresses the injection of holes from the first metal layer 10 into the organic semiconductor layer 30 when the bias voltage is applied. For example, the noise current is suppressed.

The second organic film 36b includes, for example, an electron-donating organic material. The electron-donating organic material includes, for example, an aromatic diamine compound, etc. Examples of the material of the second organic film 36b are described below. The thickness of the second organic film 36b is, for example, not less than 50 nm and not more than 100 nm.

The second organic film 36b may function as, for example, an electron blocking film. For example, the second organic film 36b suppresses the injection of electrons from the second metal layer 20 into the organic semiconductor layer 30 when the bias voltage is applied. For example, the noise current is suppressed.

By providing the organic film 36, for example, the noise current can be suppressed. High sensitivity is obtained.

Figure 5:
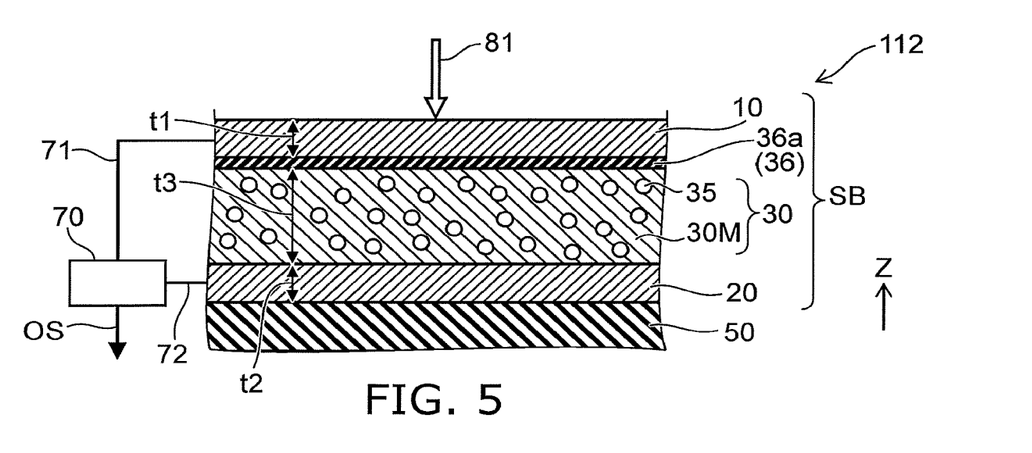
FIG. 5 is a schematic cross-sectional view illustrating another radiation detector according to the first embodiment.

FIG. 5 is a schematic cross-sectional view illustrating another radiation detector according to the first embodiment.

As shown in FIG. 5, the other radiation detector 112 according to the embodiment includes the first organic film 36a (the organic film 36). Otherwise, the radiation detector 112 is similar to the radiation detector 110.

Figure 6:
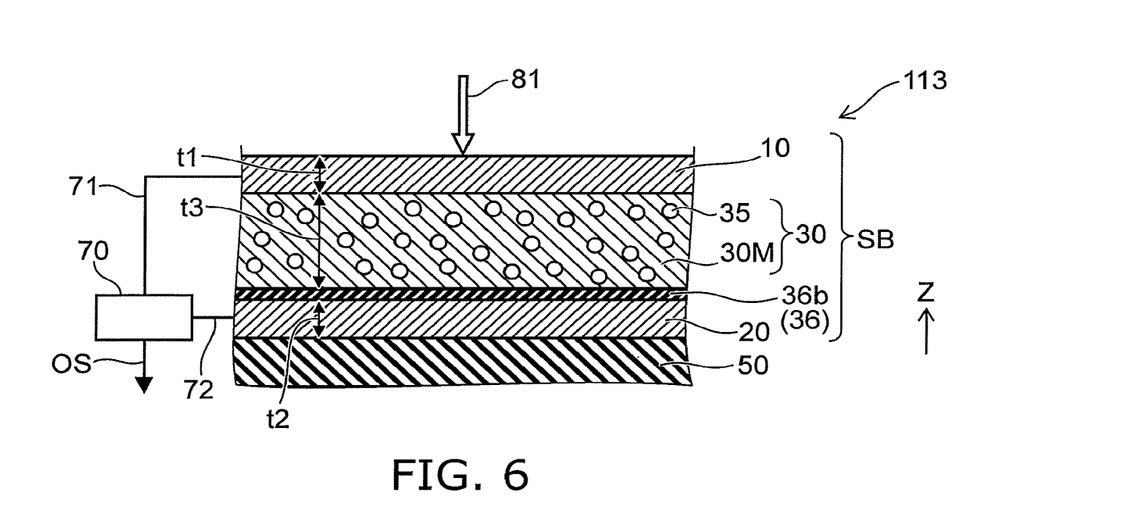
FIG. 6 is a schematic cross-sectional view illustrating another radiation detector according to the first embodiment.

FIG. 6 is a schematic cross-sectional view illustrating another radiation detector according to the first embodiment.

As shown in FIG. 6, the other radiation detector 113 according to the embodiment includes the second organic film 36b (the organic film 36). Otherwise, the radiation detector 113 is similar to the radiation detector 110.

In the radiation detectors 112 and 113 as well, for example, the noise current can be suppressed. High sensitivity is obtained.

Figure 7:
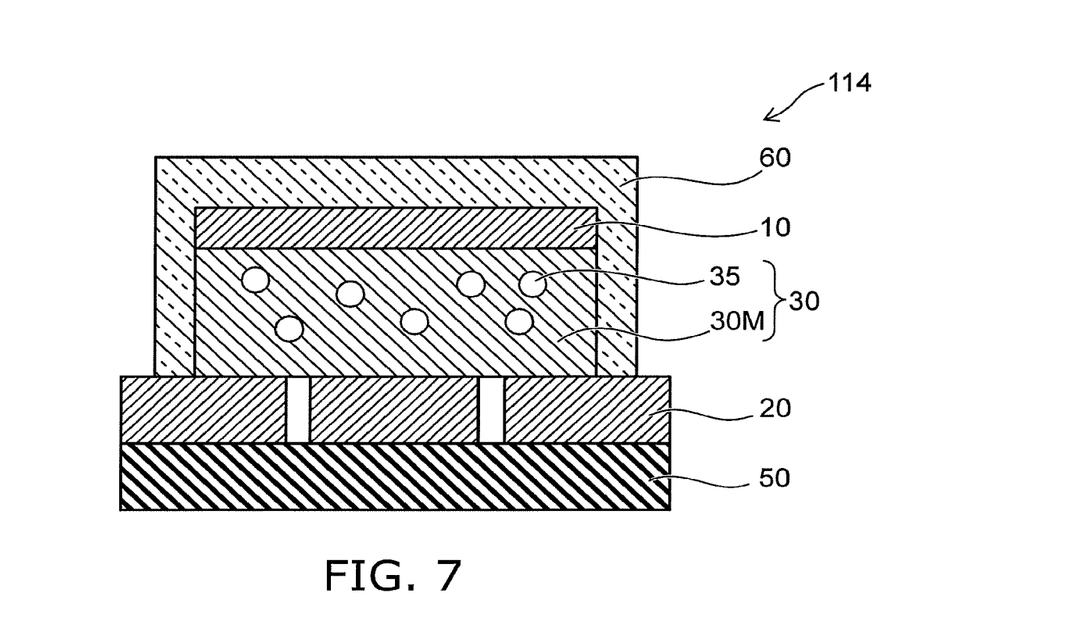
FIG. 7 is a schematic cross-sectional view illustrating another radiation detector according to the first embodiment.

FIG. 7 is a schematic cross-sectional view illustrating another radiation detector according to the first embodiment.

In the other radiation detector 114 according to the embodiment as shown in FIG. 7, a sealing member 60 is further provided in addition to the first metal layer 10, the second metal layer 20, the organic semiconductor layer 30, and the substrate 50. The substrate 50 and the sealing member 60 include, for example, glass. The outer edge of the sealing member 60 is bonded to the outer edge of the substrate 50. The first metal layer 10, the second metal layer 20, and the organic semiconductor layer 30 are provided in the space surrounded with the substrate 50 and the sealing member 60. The first metal layer 10, the second metal layer 20, and the organic semiconductor layer 30 are sealed airtightly with the substrate 50 and the sealing member 60. Thereby, stable characteristics are obtained easily. High reliability is obtained.

Multiple second metal layers 20 are provided in the example. A spatial distribution of the intensity of the radiation 81 is obtained using the multiple second metal layers 20.

Examples of the materials included in the embodiments will now be described.

Figure 8:
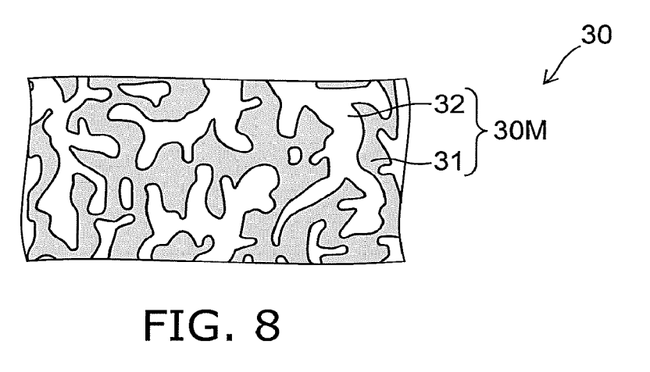
FIG. 8 is a schematic cross-sectional view illustrating a portion of the radiation detector according to the first embodiment.

FIG. 8 is a schematic cross-sectional view illustrating a portion of the radiation detector according to the first embodiment.

FIG. 8 illustrates the organic semiconductor region 30M. The organic semiconductor region 30M includes a first semiconductor region 31 of a first conductivity type, and a second semiconductor region 32 of a second conductivity type. The first conductivity type is, for example, an n-type. The second conductivity type is, for example, a p-type.

The organic semiconductor layer 30 includes, for example, the first semiconductor region 31 (e.g., an n-type semiconductor region) and the second semiconductor region 32 (e.g., a p-type semiconductor region). For example, the two regions may be mixed. For example, the organic semiconductor layer 30 may have, for example, a bulk heterojunction structure. For example, a high photoelectric conversion efficiency is obtained using the bulk heterojunction structure. Multiple n-type semiconductor regions and multiple p-type semiconductor regions may be arranged alternately in the organic semiconductor layer 30. A conductive region may be provided between one n-type semiconductor region and one p-type semiconductor region. The conductive region includes, for example, at least one selected from the group consisting of silver and gold.

For example, the p-type semiconductor region includes a p-type semiconductor compound. The p-type semiconductor compound is, for example, a hole-transport organic compound. The p-type semiconductor compound is, for example, a donor compound. For example, the p-type semiconductor compound easily donates electrons. For example, the ionization potential of the p-type semiconductor compound is small. The p-type semiconductor compound is, for example, electron-donating.

The p-type semiconductor compound includes, for example, at least one selected from the group consisting of a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a condensed aromatic carbocyclic compound, and a metal complex. The condensed aromatic carbocyclic compound recited above includes, for example, at least one selected from the group consisting of a naphthalene derivative, an anthracene derivative, a phenanthrene derivative, a tetracene derivative, a pyrene derivative, a perylene derivative, and a fluoranthene derivative. The metal complex recited above includes a nitrogen-containing heterocyclic compound as a ligand.

For example, the n-type semiconductor region includes an n-type semiconductor compound. The n-type semiconductor compound is, for example, an electron-transport organic compound. The n-type semiconductor compound is, for example, an acceptor compound. For example, the n-type semiconductor compound easily accepts electrons. For example, the electron affinity of the n-type semiconductor compound is large.

The n-type semiconductor compound includes, for example, at least one selected from the group consisting of a condensed aromatic carbocyclic compound, a heterocyclic compound, a polyarylene compound, a fluorene compound, a cyclopentadiene compound, a silyl compound, and a metal complex. The condensed aromatic carbocyclic compound recited above includes, for example, at least one selected from the group consisting of a naphthalene derivative, an anthracene derivative, a phenanthrene derivative, a tetracene derivative, a pyrene derivative, a perylene derivative, and a fluoranthene derivative. The heterocyclic compound recited above includes, for example, a nitrogen atom, an oxygen atom, and a sulfur atom. The heterocyclic compound recited above is, for example, five-membered to seven-membered. The heterocyclic compound recited above includes, for example, at least one selected from the group consisting of pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazol, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine. The metal complex recited above includes, for example, a nitrogen-containing heterocyclic compound as a ligand.

At least one of the p-type semiconductor compound or the n-type semiconductor compound may include a dye. The dye includes, for example, at least one selected from the group consisting of a cyanine dye, a styryl dye, a hemicyanine dye, a merocyanine dye, a trinuclear merocyanine dye, a tetranuclear merocyanine dye, a rhodacyanine dye, a complex cyanine dye, a complex merocyanine dye, an allopolar dye, an oxonol dye, a hemioxonol dye, a squarylium dye, a croconium dye, an azamethine dye, a coumarin dye, an arylidene dye, an anthraquinone dye, a triphenylmethane dye, an azo dye, an azomethine dye, a spiro compound, a metallocene dye, a fluorenone dye, a fulgide dye, a perylene dye, a phenazine dye, a phenothiazine dye, a quinone dye, an indigo dye, a diphenylmethane dye, a polyene dye, an acridine dye, an acridinone dye, a diphenylamine dye, a quinacridone dye, a quinophthalone dye, a phenoxazine dye, a phthaloperylene dye, a porphyrin dye, a chlorophyll dye, a phthalocyanine dye, a metal complex dye, and a condensed aromatic carbocyclic dye. The merocyanine dye recited above includes, for example, zeromethine-merocyanine (simple merocyanine). The metal complex dye recited above includes, for example, at least one selected from the group consisting of a naphthalene derivative, an anthracene derivative, a phenanthrene derivative, a tetracene derivative, a pyrene derivative, a perylene derivative, and a fluoranthene derivative.

The metal complex recited above includes, for example, a ligand. The ligand is coordinated to the metal. The ligand includes at least one of a nitrogen atom, an oxygen atom, or a sulfur atom. The metal ion inside the metal complex includes, for example, at least one selected from the group consisting of a beryllium ion, a magnesium ion, an aluminum ion, a gallium ion, a zinc ion, an indium ion, and a tin ion. The metal ion inside the metal complex may include, for example, at least one selected from the group consisting of a beryllium ion, an aluminum ion, a gallium ion, and a zinc ion. The metal ion inside the metal complex may include, for example, at least one selected from the group consisting of an aluminum ion and a zinc ion.

The ligand includes, for example, a nitrogen-containing heterocyclic ligand. The number of carbons in the nitrogen-containing heterocyclic ligand is, for example, not less than 1 and not more than 30. The number of carbons in the nitrogen-containing heterocyclic ligand may be, for example, not less than 2 and not more than 20; and the number of carbons in the nitrogen-containing heterocyclic ligand may be, for example, not less than 3 and not more than 15. The ligand may be a monodentate ligand. The ligand may be, for example, a bidentate or higher ligand.

The ligand includes, for example, at least one selected from the group consisting of a pyridine ligand, a bipyridyl ligand, a quinolinol ligand, and a hydroxyphenylazole ligand. The hydroxyphenylazole ligand includes, for example, at least one selected from the group consisting of hydroxyphenylbenzimidazole, a hydroxyphenylbenzoxazole ligand, and a hydroxyphenylimidazole ligand.

The ligand includes, for example, an alkoxy ligand. The number of carbons in the alkoxy ligand is, for example, not less than 1 and not more than 30. The number of carbons in the alkoxy ligand may be, for example, not less than 1 and not more than 20. The number of carbons in the alkoxy ligand may be, for example, not less than 1 and not more than 10. The alkoxy ligand includes, for example, at least one selected from the group consisting of methoxy, ethoxy, butoxy, and 2-ethylhexyloxy.

The ligand includes, for example, an aryloxy ligand. The number of carbons in the aryloxy ligand is, for example, not less than 6 and not more than 30. The number of carbons in the aryloxy ligand may be, for example, not less than 6 and not more than 20. The number of carbons in the aryloxy ligand may be, for example, not less than 6 and not more than 12. The aryloxy ligand includes, for example, at least one selected from the group consisting of phenyloxy, 1-naphthyloxy, 2-naphthyloxy, 2,4,6-trimethylphenyloxy, and 4-biphenyloxy.

The ligand includes, for example, a heteroaryloxy ligand. The number of carbons in the heteroaryloxy ligand is, for example, not less than 1 and not more than 30. The number of carbons in the heteroaryloxy ligand is, for example, not less than 1 and not more than 20. The number of carbons in the heteroaryloxy ligand is, for example, not less than 1 and not more than 12. The heteroaryloxy ligand includes, for example, at least one selected from the group consisting of pyridyloxy, pyrazyloxy, pyrimidyloxy, and quinolyloxy.

The ligand includes, for example, an alkylthio ligand. The number of carbons in the alkylthio ligand is, for example, not less than 1 and not more than 30. The number of carbons in the alkylthio ligand may be, for example, not less than 1 and not more than 20. The number of carbons in the alkylthio ligand is, for example, not less than 1 and not more than 12. The alkylthio ligand includes, for example, at least one selected from the group consisting of methylthio and ethylthio.

The ligand includes, for example, an arylthio ligand. The number of carbons in the arylthio ligand is, for example, not less than 6 and not more than 30. The number of carbons in the arylthio ligand may be, for example, not less than 6 and not more than 20. The number of carbons in the arylthio ligand may be, for example, not less than 6 and not more than 12. The arylthio ligand includes, for example, phenylthio.

The ligand includes, for example, a heterocyclic-substituted thio ligand. The number of carbons in the heterocyclic-substituted thio ligand is, for example, not less than 1 and not more than 30. The number of carbons in the heterocyclic-substituted thio ligand may be, for example, not less than 1 and not more than 20. The number of carbons in the heterocyclic-substituted thio ligand may be, for example, not less than 1 and not more than 12. The heterocyclic-substituted thio ligand includes, for example, at least one selected from the group consisting of pyridylthio, 2-benzimizolylthio, 2-benzoxazolylthio, and 2-benzothiazolylthio.

The ligand includes, for example, a siloxy ligand. The number of carbons in the siloxy ligand is, for example, not less than 1 and not more than 30. The number of carbons in the siloxy ligand may be, for example, not less than 3 and not more than 25. The number of carbons in the siloxy ligand may be, for example, not less than 6 and not more than 20. The siloxy ligand includes, for example, at least one selected from the group consisting of a triphenylsiloxy group, a triethoxysiloxy group, and a triisopropylsiloxy group.

The ligand includes, for example, at least one selected from the group consisting of a nitrogen-containing heterocyclic ligand, an aryloxy ligand, a heteroaryloxy group, and a siloxy ligand. The ligand includes, for example, at least one selected from the group consisting of a nitrogen-containing heterocyclic ligand, an aryloxy ligand, and a siloxy ligand.

The second metal layer 20 is not light-transmissive. The thickness of the second metal layer 20 is, for example, not less than 10 μm and not more than 40 μm. The second metal layer 20 includes, for example, at least one selected from the group consisting of Au and Pt.

The first metal layer 10 includes, for example, at least one selected from the group consisting of Al, Ag, Mg, and Ni. The thickness of the first metal layer 10 is, for example, not less than 100 nm and not more than 500 nm.

The first organic film 36a includes, for example, an electron-accepting organic material. The electron-accepting material includes, for example, at least one selected from the group consisting of fullerene and a carbon nanotube. The electron-accepting material may include, for example, a derivative of these substances. The fullerene includes, for example, at least one of $C_{60}$ or $C_{70}$. The electron-accepting material may include, for example, at least one selected from the group consisting of an oxadiazole derivative, an anthraquinodimethane derivative, a diphenylquinone derivative, bathocuproine, and bathophenanthroline. The electron-accepting material may include a derivative of these substances. The electron-accepting material may include at least one selected from the group consisting of a triazole compound, a tris(8-hydroxyquinolinato)aluminum complex, a bis(4-methyl-8-quinolinato)aluminum complex, a distyrylarylene derivative, and a silole compound.

The thickness of the first organic film 36a is, for example, not less than 10 nm and not more than 200 nm. For example, the noise current can be suppressed effectively. The thickness of the first organic film 36a may be, for example, not less than 30 nm and not more than 150 nm. The thickness of the first organic film 36a may be, for example, not less than 50 nm and not more than 100 nm.

For example, the ionization potential of the first organic film 36a is larger than the work function of the first metal layer 10. The difference between the ionization potential of the first organic film 36a and the work function of the first metal layer 10 is, for example, 1.3 eV or more.

For example, the electron affinity of the first organic film 36a is not less than the electron affinity of the organic semiconductor layer 30.

The second organic film 36b includes, for example, an electron-donating organic material. The electron-donating organic material includes, for example, a low molecular-weight material. The low molecular-weight material includes, for example, at least one selected from the group consisting of an aromatic diamine compound, oxazole, oxadiazole, triazole, imidazole, imidazolone, a stilbene derivative, a pyrazoline derivative, tetrahydroimidazole, polyaryl alkane, butadiene, 4,4',4"-tris(N-(3-methyl phenyl) N-phenylamino)triphenylamine (m-MTDATA), a porphyrin compound, a riazole derivative, an oxadiazole derivative, an imidazole derivative, a polyaryl alkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, and a silazane derivative. The aromatic diamine compound recited above includes, for example, at least one selected from the group consisting of N,N'-bis(3-methyl phenyl)-(1,1'-biphenyl)-4,4'-diamine (TPD) and 4,4'-bis(N-(naphthyl)-N-phenyl-amino)biphenyl (α-NPD). The porphyrin compound recited above includes, for example, at least one selected from the group consisting of porphyrin, tetraphenylporphine-copper, phthalocyanine, copper phthalocyanine, and titanium phthalocyanine oxide.

The electron-donating organic material includes, for example, a high polymer material. The high polymer material includes, for example, at least one selected from the group consisting of phenylene vinylene, fluorene, carbazole, indole, pyrene, pyrrole, picoline, thiophene, acetylene, and diacetylene. The high polymer material may include a derivative of these substances.

For example, the electron affinity of the second organic film 36a is larger than the work function of the second metal layer 20. The difference between the electron affinity of the second organic film 36a and the work function of the second metal layer 20 is, for example, 1.3 eV or more. The ionization potential of the second organic film 36a is not more than the ionization potential of the organic semiconductor layer 30.

The thickness of the second organic film 36b is, for example, not less than 10 nm and not more than 200 nm. The noise current is suppressed effectively. The thickness of the second organic film 36b may be, for example, not less than 30 nm and not more than 150 nm. The thickness of the second organic film 36b may be, for example, not less than 50 nm and not more than 100 nm.

Second Embodiment

Figure 9:
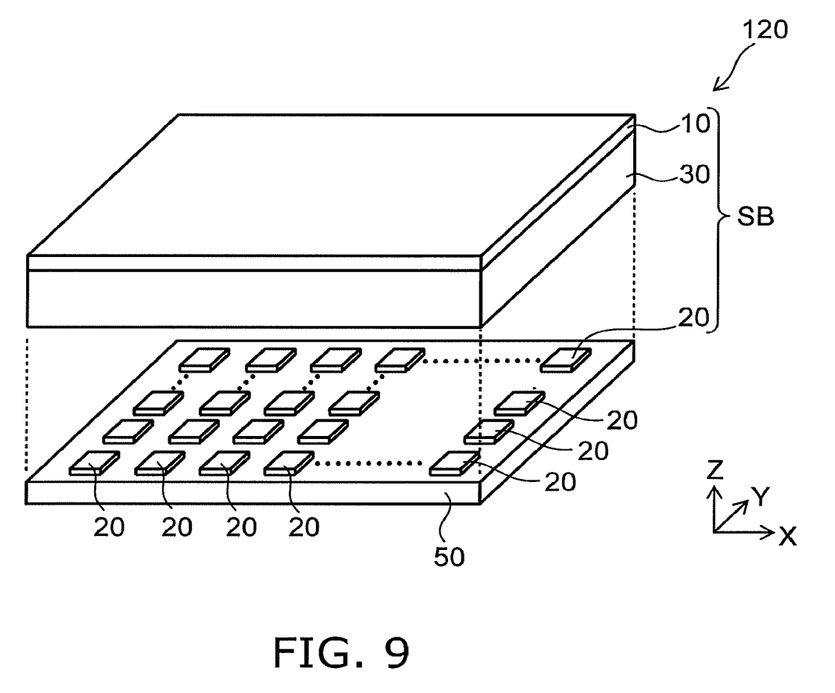
FIG. 9 is a schematic perspective view illustrating a radiation detector according to a second embodiment.

FIG. 9 is a schematic perspective view illustrating a radiation detector according to a second embodiment.

As shown in FIG. 9, the radiation detector 120 includes the stacked body SB. The stacked body SB includes the first metal layer 10, the second metal layer 20, and the organic semiconductor layer 30. The substrate 50 is provided in the example. In FIG. 9, some of the components included in the radiation detector 120 are drawn as being separated from each other for easier viewing of the drawing.

The second metal layer 20 is multiply provided in the radiation detector 120. The multiple second metal layers 20 are arranged along a plane (e.g., the X-Y plane) crossing a first direction (the Z-axis direction) from the second metal layer 20 toward the first metal layer 10. The X-Y plane is perpendicular to the Z-axis direction.

The multiple second metal layers 20 are arranged along a second direction and a third direction along the plane (e.g., the X-Y plane). The multiple second metal layers 20 are arranged along, for example, an X-axis direction and a Y-axis direction. For example, the multiple second metal layers 20 are arranged in a matrix configuration.

The first metal layer 10 and the organic semiconductor layer 30 are provided to be continuous. For example, the first metal layer 10 overlaps a region between one of the multiple second metal layers 20 and another one of the multiple second metal layers 20 in the first direction (the Z-axis direction). For example, the organic semiconductor layer 30 overlaps a region between one of the multiple second metal layers 20 and another one of the multiple second metal layers 20 in the first direction.

An image that corresponds to the radiation 81 is obtained in the radiation detector 120. The configurations described in reference to the first embodiment and modifications of the configurations are applicable to the radiation detector 120. In the radiation detector 120 as well, a radiation detector can be provided in which the sensitivity can be increased.

For example, the organic semiconductor region 30M and the multiple particles 35 may be provided in the radiation detectors 111 to 114 and 120.

According to the embodiments, a radiation detector can be provided in which the sensitivity can be increased.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as metal layers, organic semiconductor layers, detection circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a stacked body including
a first metal layer,
a second metal layer, and
an organic semiconductor layer provided between the first metal layer and the second metal layer;
wherein
the organic semiconductor layer includes:
a plurality of particles; and
an organic semiconductor region, and
at least a portion of the organic semiconductor region is provided around the particles,
wherein the particles include at least one selected from the group consisting of PbS, ZnSe, $Bi_2O_3$, and $HfO_2$.

2. The detector according to claim 1, wherein the radiation includes β-rays.

3. The detector according to claim 1, wherein an atomic weight of a second metal included in the second metal layer is larger than an atomic weight of a first metal included in the first metal layer.

4. The detector according to claim 3, wherein
the second metal is gold or platinum, and
a thickness of the second metal layer is not less than 10 micrometers and not more than 40 micrometers.

5. The detector according to claim 3, wherein a work function of the second metal is greater than 4.7 electron volts.

6. The detector according to claim 3, wherein the first metal includes at least one selected from the group consisting of aluminum, silver, nickel, and magnesium.

7. The detector according to claim 1, wherein a thickness of the first metal layer is 100 nanometers or more.

8. The detector according to claim 1, wherein a thickness of the organic semiconductor layer is not less than 10 micrometers and not more than 200 micrometers.

9. The detector according to claim 1, wherein a size of the particles is 100 nanometers or less.

10. The detector according to claim 1, wherein the organic semiconductor region includes a first semiconductor region of a first conductivity type, and a second semiconductor region of a second conductivity type.

11. The detector according to claim 1, further comprising an organic film provided in at least one of a first position between the first metal layer and the organic semiconductor layer or a second position between the second metal layer and the organic semiconductor layer.

12. The detector according to claim 1, wherein the radiation is incident on the organic semiconductor layer after passing through the first metal layer.

* * * * *